United States Patent [19]

Azuma et al.

[11] Patent Number: 5,690,727
[45] Date of Patent: Nov. 25, 1997

[54] THIN FILMS OF $ABO_3$ WITH EXCESS B-SITE MODIFIERS AND METHOD OF FABRICATING INTEGRATED CIRCUITS WITH SAME

[75] Inventors: Masamichi Azuma; Carlos A. Paz de Araujo; Michael C. Scott, all of Colorado Springs, Colo.

[73] Assignees: Symetrix Corporation, Colorado Springs, Colo.; Matsushita Electronics Corporation, Osaka, Japan

[21] Appl. No.: 789,469

[22] Filed: Jan. 27, 1997

Related U.S. Application Data

[60] Division of Ser. No. 270,819, Jul. 5, 1994, Pat. No. 5,624,707, which is a continuation-in-part of Ser. No. 165,082, Dec. 10, 1993, which is a continuation-in-part of Ser. No. 132,744, Oct. 6, 1993, Pat. No. 5,514,822, which is a continuation-in-part of Ser. No. 993,380, Dec. 18, 1992, Pat. No. 5,456,945, Ser. No. 981,133, Nov. 24, 1992, Pat. No. 5,423,285, and Ser. No. 965,190, Oct. 23, 1992, abandoned, which is a continuation-in-part of Ser. No. 807,439, Dec. 13, 1991, abandoned, said Ser. No. 981,133, is a continuation-in-part of Ser. No. 807,439.

[51] Int. Cl.$^6$ .................. C04B 35/46; C07F 3/00; C07F 7/28

[52] U.S. Cl. .................. 106/287.18; 106/287.19; 501/134; 501/138

[58] Field of Search .................. 106/287.18, 287.19; 501/134, 138

[56] References Cited

U.S. PATENT DOCUMENTS

| | | | |
|---|---|---|---|
| 4,963,390 | 10/1990 | Lipeles et al. | 427/110 |
| 5,122,923 | 6/1992 | Matsubara et al. | 361/321 |
| 5,166,759 | 11/1992 | Ueno et al. | 257/624 |
| 5,198,269 | 3/1993 | Swartz et al. | 427/226 |
| 5,514,822 | 5/1996 | Scott et al. | 556/28 |

OTHER PUBLICATIONS

E. Fujii, et al; ULSI DRAM Technology with $Ba_{0.7}Sr_{0.3}TiO_3$ Film of 1.3nm Equivalent $SiO_2$ Thickness and $10^{-9}$ A/cm$^2$ Leakage Current; IEDM Technical Digest, (1992), no month avail. pp. 10.3.1–10.3.4.

Kuniaki Koyama, et al.; A Stacked Capacitor with $(Ba_xSr_{1-x})TiO_3$ For 256 DRAM; IEDM, (Dec. 1991); pp. 32.1.1–32.1.4.

W.D. Kingery, et al.; Introduction to Ceramics, Second Edition; pp. 969–971 no date avail.

G.M. Vest, et al.; Synthesis of Metallo–Organic Compounds For MOD Powders and Films; Materials Research Society Symp. Proc. vol. 60, (1986); no month avail. pp. 35–42.

Robert W. Vest, et al.; $PbTiO_3$ Films From Metalloorganic Precursors; IEEE Transactions on Ultrasonics, Ferroelectrics, and Frequency Control, vol. 35, No. 6, (Nov. 1988); pp. 711–717.

M. Azuma, et al.; Electrical Characteristics of High Dielectric Constant Materials for Integrated Ferroelectrics; ISIF (1992); no month avail. pp. 109–117.

J.V. Mantese, et al.; Metalorganic Deposition (MOD): A Nonvacuum, Spin–on, Liquid–Based, Thin Film Method; MRS Bulletin, (Oct. 1989); pp. 48–53.

B.M. Melnick, et al.; Process Optimization and Characterization of Device Worthy Sol–Gel Based PZT for Ferroelectric Memories; Ferroelectrics, 1990 vol. 109, (1990); no month avail. pp. 1–23.

*Primary Examiner*—David Brunsman
*Attorney, Agent, or Firm*—Duft, Graziano & Forest, P.C.

[57] ABSTRACT

A method for fabricating an integrated circuit capacitor having a dielectric layer comprising BST with excess B-site material, such as titanium, added. A polyoxyalkylated metal liquid precursor solution is prepared comprising a stock solution of BST of greater then 99.999% purity blended with excess B-site material such as titanium such that the titanium is in the range of 0–100 mol %. A xylene exchange is then performed to adjust the viscosity of the solution for spin-on application to a substrate. The precursor is spun on a first electrode, dried at 400° C. for 2 minutes, then annealed at 650° C. to 800° C. for about an hour to form a layer of BST with excess titanium. A second electrode is deposited, patterned, and annealed at between 650° C. to 800° C. for about 30 minutes. The resultant capacitor exhibits an enlarged dielectric constant with only a small increase in leakage current.

4 Claims, 3 Drawing Sheets

THIN FILMS OF ABO₃ WITH EXCESS B-SITE MODIFIERS AND METHOD OF FABRICATING INTEGRATED CIRCUITS WITH SAME

BACKGROUND OF THE INVENTION

This application is a division of application Ser. No. 08/270,819 filed Jul. 5, 1994, now U.S. Pat. No. 5,624,707 which is a continuation-in-part of U.S. patent application Ser. No. 08/165,082 filed Dec. 10, 1993, which is in turn a continuation-in-part of U.S. patent application Ser. No. 08/132,744 filed Oct. 6, 1993, now U.S. Pat. No. 5,514,822, which is in turn a continuation-in-part of U.S. patent applications Ser. No. 07/993,380 filed Dec. 18, 1992, now U.S. Pat. No. 5,456,945, Ser. No. 07/981,133 filed Nov. 24, 1992, now U.S. Pat. No. 5,423,285 and Ser. No. 07/985,190 filed Oct. 23, 1992, now abandoned; the latter two applications are in turn continuations-in-part of U.S. patent application Ser. No. 07/807,439 filed Dec. 13, 1991, now abandoned.

FIELD OF THE INVENTION

This invention relates to the fabrication of thin films used in integrated circuits, more specifically to fabrication of materials used in high dielectric constant capacitors for integrated circuits.

STATEMENT OF THE PROBLEM

Metal oxide materials, such as barium strontium titanate ("BST"), have become important for making integrated circuit thin film capacitors having high dielectric constants. Such capacitors are useful in fabricating integrated circuit memories such as DRAMs. See for example, Kuniaki Koyama et al., "A Stacked Capacitor with $(Ba_xSr_{1-x})TiO_3$ For 256M DRAM" in IDEM (International Electron Devices Meeting) *Technical Digest*, December 1991, pp. 32.1.1–32.1.4, and U.S. Pat. No. 5,122,923 issued to Shogo Matsubara et al. The capacitors used in a DRAM integrated circuit are the predominant element determining the size of each DRAM cell. To reduce the DRAM cell size, and thereby increase DRAM cell densities in an integrated circuit, requires reduction in the size of the capacitor. Reducing the capacitor size is achieved by increasing the dielectric constant of the material used in the dielectric layer of the capacitor so that a smaller surface area is required for a capacitor having the desired dielectric properties. Prior methods for increasing the dielectric constant of material have also increased the leakage current of the material. Excessive leakage current renders the material unfit for capacitors in integrated circuits and in particular, unfit for capacitors in DRAM cells. It remains a problem in the field to increase the dielectric constant of materials, even for high dielectric constant material such as BST, without significantly increasing the leakage current.

SOLUTION OF THE PROBLEM

The present invention improves upon prior fabrication methods for BST to increase the dielectric constant of the dielectric material for use in integrated circuit memories, such as DRAMs, by blending excess B-site materials with the barium, strontium, and titanium liquid precursors used to produce the dielectric layer. The excess B-site material increases the real part of the dielectric constant of the dielectric layer of the capacitor with little or no increase in leakage current.

The process of the present invention includes blending of excess B-site material such as titanium with liquid precursors comprising barium, strontium, and titanium to form a homogenous liquid suitable for spin-on deposition processes. The liquid precursor preferably includes the B-site material as a substituent to an organic complex. Liquid precursors suitable for this process are preferably metal carboxylates or metal alkoxides. Co-pending U.S. patent application Ser. No. 08/132,744 filed Oct. 6, 1993, recites the use of an alkoxycarboxylate liquid precursor in the fabrication of BST. Co-pending U.S. patent application Ser. No. 08/185,082 filed Dec. 10, 1993, which is hereby incorporated by reference, recites the use of a spin-on process with liquid precursors to form a layer BST. Applying similar "spin-on" methods for fabrication to the present invention permits more accurate control of the structure and distribution of the excess B-site material within the BST dielectric layer of integrated circuit capacitors.

The quantity of excess B-site material preferably ranges from an amount greater than zero (i.e., about 0.01 mole percent) to 100 mole percent ("mol %") of the stoichiometric amount that is required to satisfy the general formula ABO₃, wherein a 1:1:3 molar ratio exists between A (an A-site material), B (a B-site material), and oxygen. Accordingly, the total amount of B-site material preferably ranges from about 100.01 to about 200% of the stoichiometric amount from the general formula. This excess B-site material more preferably ranges from about 0.1 to 20 mol %, and most preferably ranges from about 1 to 3 mol % of the stoichiometric amount.

The precursor solution including excess B-site material is applied onto a substrate preferably using a spin-on process to form a thin film. The coated substrate is then heated preferably within the range of 200° C. to 500° C. to remove the organic residue from the applied thin film. The thin film is the annealed preferably at a temperature ranging from about 600° C. to 850° C. in the presence of oxygen. These methods result in fabrication of high quality BST with excess B-site material exhibiting improved dielectric properties for use In integrated circuit capacitors such as DRAMs. Numerous other features, objects and advantages of the invention will become apparent from the following description when read in conjunction with the accompanying drawings.

DETAILED DESCRIPTION OF THE PREFERRED EMBODIMENT

Figure 1:
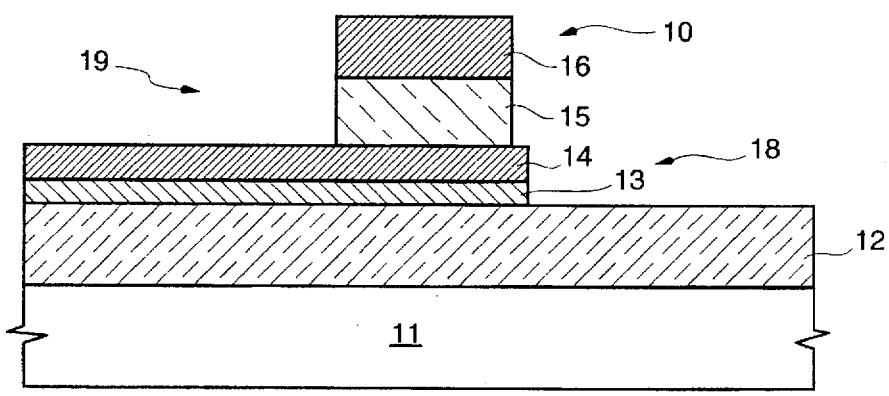
FIG. 1 is a cross-sectional view of an integrated circuit capacitor fabricated according to the present invention.

FIG. 1 depicts a thin film capacitor 10, which is fabricated according to the methods discussed below. The capacitor 10 is formed on a single crystal silicon wafer 11 having a thick layer 12 of silicon dioxide formed thereon, as known in the art. An adhesion layer 13 of titanium of about 200 Å thickness is then formed followed by a first electrode layer 14 of platinum, of about 2000 Å thickness. Both layers 13 and 14 are preferably formed through the use of conventional sputtering protocols. A dielectric layer 15, preferably a metal oxide, such as BST, is formed next atop first electrode layer 14. BST dielectric layer 15 preferably includes excess B-site material as described in detail below. A second electrode 16 (also preferably about 2000 Å thick), is sputtered atop dielectric layer 15.

In the integrated circuit art, the silicon crystal 11 is often referred to as a "substrate". Herein, "substrate" may be used to refer to the silicon layer 11, but more generally will refer to any support for another layer. By way of example, the substrate 18 for the dielectric layer 15 is most immediately platinum first electrode 14, but also can be interpreted broadly to include layers 11, 12, and 13 as well.

The term "metal oxide" herein means a material of the general form $ABO_3$ where A and B are cations and O is the anion oxygen. The term is intended to include materials where A and B represent multiple elements; for example, it includes materials of the form $A'A''BO_3$, $AB'B''O_3$, and $A'A''B'B''O_3$ where A', A", B' and B" are different metal elements. Preferably, A, A', A", are metals selected from the group of metals consisting of Ba, Bi, Sr, Pb, Ca, and La, and B, B', and B" are metals selected from the group consisting of Ti, Zr, Ta, Mo, W, and Nb. B, B', and B" are collectively referred to herein as B-site materials.

The crystalline metal oxide of layer 15 preferably has a perovskite type structure, which is known in the art. Many of these metal oxides are classified as ferroelectrics though some they may not exhibit ferroelectricity at room temperature. Nevertheless, ferroelectrics of the invention have relatively high dielectric constants, and are useful in high dielectric constant capacitors, whether or not they exhibit ferroelectric properties at normal operating temperatures.

In the present invention, excess B-site material is blended with the metal oxide material. The "stoichiometric amount" of a B-site material hereof is hereby defined to be the amount required by the chemical formula for the stable compound. By way of example, a "stoichiometric" metal oxide precursor solution is a precursor solution including a plurality of metals, and in which the relative amounts of each metal in the solution has the same proportion as the proportion of the metal in the chemical formula for the desired metal oxide to be fabricated from the solution. In metal oxides having the formula $ABO_3$, there is one A-site atom and one B-site atom combined with three oxygen atoms (1:1:3); however the A-site and B-site material may be freely substituted for several equivalent materials as described above.

In a material of the form $AA'BO_3$, the ratio of A to A' A-site material is variable but the total number of A-site atoms is fixed as above with respect to B-site atoms and oxygen atoms. This ratio may be expressed as a formula template $A_xA'_{1-x}BO_3$ indicating that the total of A-site atoms equals one (X+1−X=1) combined with one B-site atom and three oxygen atoms. Therefore, though the total of A-site and B-site atoms is fixed by the stoichiometric formula, the ratio of A to A' A-site atoms is expressed as the ratio X/(1−X).

Figure 5:
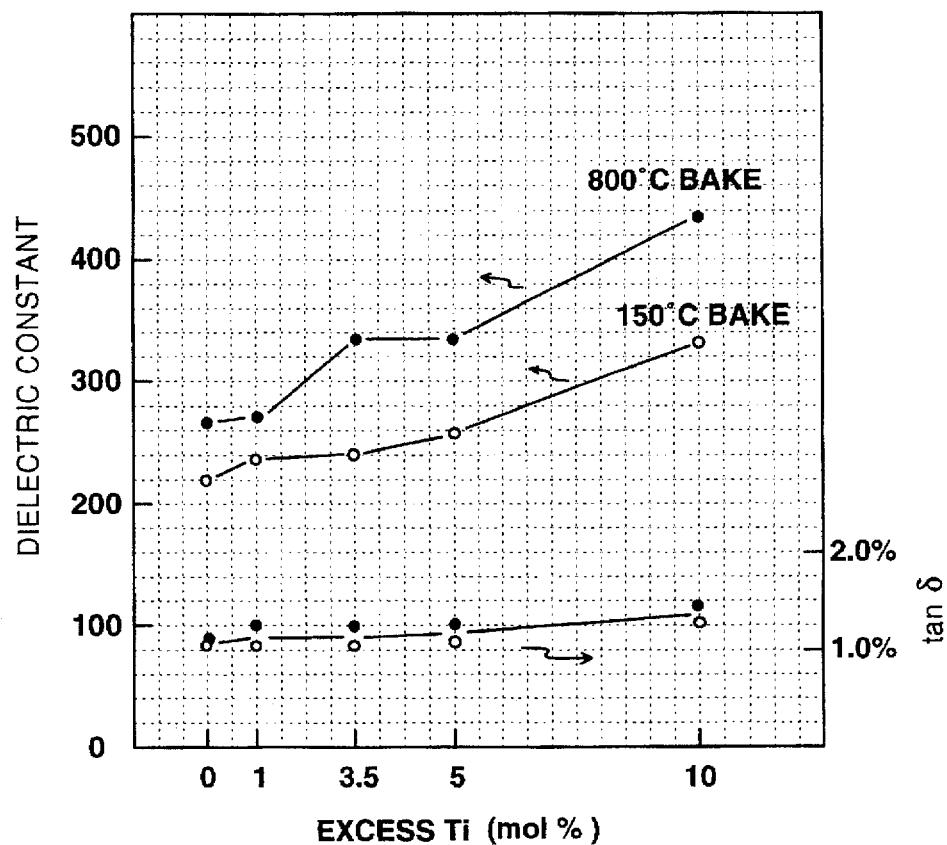
FIG. 5 is a graph of the dielectric constant, ε, and dissipation factor, tan δ, versus excess titanium content for excess B-site material for BST capacitors made according to the process of the invention.

In the discussions herein, and particularly with respect to the abscissa of FIG. 5, the amount of excess B-site material is expressed in terms of mole % units (denoted mol %). This unit is a measure of the number of atoms of the excess B-site material as a percentage of the stoichiometric amount of B-site atoms in the underlying metal oxide material. For example, if the material is $Ba_{0.7}Sr_{0.3}TiO_3$, and the excess B-site material concentration is 10 mol %, then there is 10% more titanium than is present in the stoichiometric precursor solution.

Figure 2:
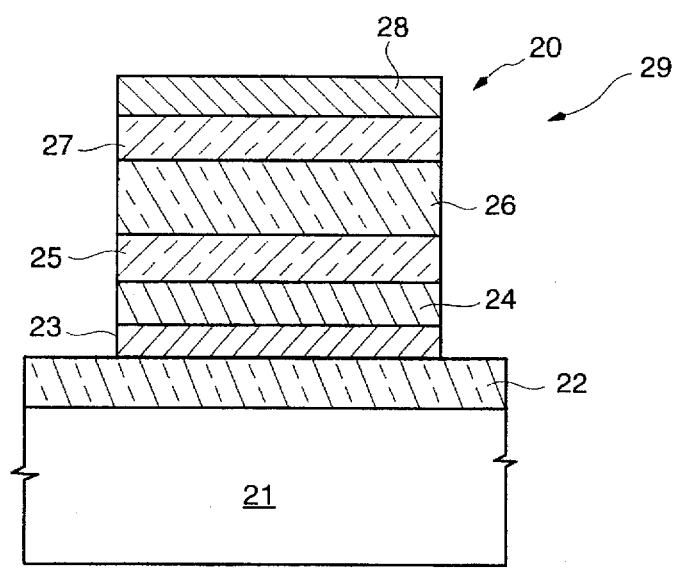
FIG. 2 is a cross-sectional view of another embodiment of an integrated circuit capacitor fabricated according to the present invention which includes low leakage dielectric buffer layers.

FIG. 2 depicts a second embodiment of the present invention, i.e., a capacitor 20 including substrate 21, insulating layer 22, adhesion layer 23, first electrode 24, second electrode 28, buffer layers 25 and 27, and dielectric layer 26. Layer 26 is preferably a ferroelectric material or other metal oxide. Buffer layers 25 and 27 are preferably made of a low-leakage dielectric material such as BST fabricated as described below. Other materials that are useful as the buffer layers 25 and 27 are $SiO_2$, $Si_3N_4$, $Ta_2O_5$, and $SrTiO_3$. Low-leakage buffer layers 25 and 27 are used when the principal dielectric 26 has more electrical leakage than desirable; for example, some ferroelectric materials of high polarizability, such as those used in non-volatile memories, may have an excessive amount of leakage current, and therefore low-leakage buffer layers 25, 27 are useful to decrease the overall leakage of the capacitor 20.

Figure 3:
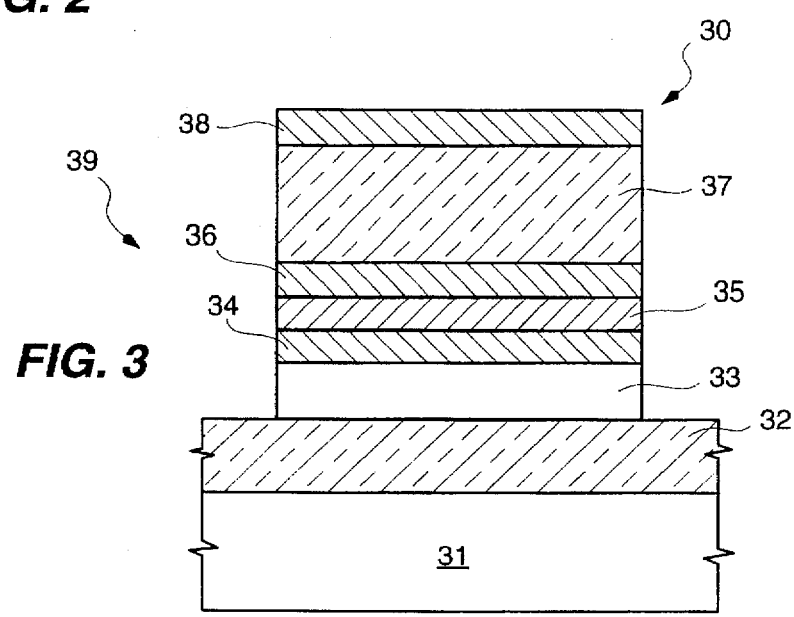
FIG. 3 is a cross-sectional view of a further exemplary embodiment of an integrated circuit capacitor fabricated according to the present invention which includes adhesion and barrier layers.

FIG. 3 depicts a third embodiment of the present invention, i.e., a capacitor 30 including substrate 31, insulating layer 32, adhesion layer 34, first electrode 36, second electrode 38, and a dielectric material 37 made by the process described below. It also includes a polysilicon layer 33 and a barrier layer 35 preferably made of titanium nitride. The details of these layers and their fabrication, as well as adhesion layer 23 are given in co-pending U.S. patent application Ser. No. 08/165,133 filed Dec. 10, 1993, which is hereby incorporated by reference herein.

Other materials may be used for any of the layers discussed above. These other materials may include, by way of example, silicon nitride for insulating layers 12, 22, and 32, gallium arsenide, indium antimonide, magnesium oxide, strontium titanate, sapphire or quartz for substrate 11, 21, or 31, and many other adhesion layer, barrier layer, and electrode materials. Furthermore, it should be understood that FIGS. 1 and 2 are not meant to be actual cross-sectional views of any particular portion of an actual electronic device, but are merely idealized representations which are employed to more clearly and fully depict the structure and process of the invention than would otherwise be possible. Accordingly, the relative thicknesses of the individual layers are not shown proportionately; otherwise, some layers, such as the substrate 21 and insulator 22, would be so thick as to make the drawing unwieldy. It should also be understood that the capacitors 10, 20 and 30 preferably form a portion of an integrated circuit 19, 29, and 39 which includes other electronic devices, such as transistors or other capacitors. These other devices are not depicted, for purposes of clarity in addition, dielectric layers 15, 26, and 37 may be incorporated into other devices, such as ferroelectric FETs, as well as capacitors.

Figure 4:
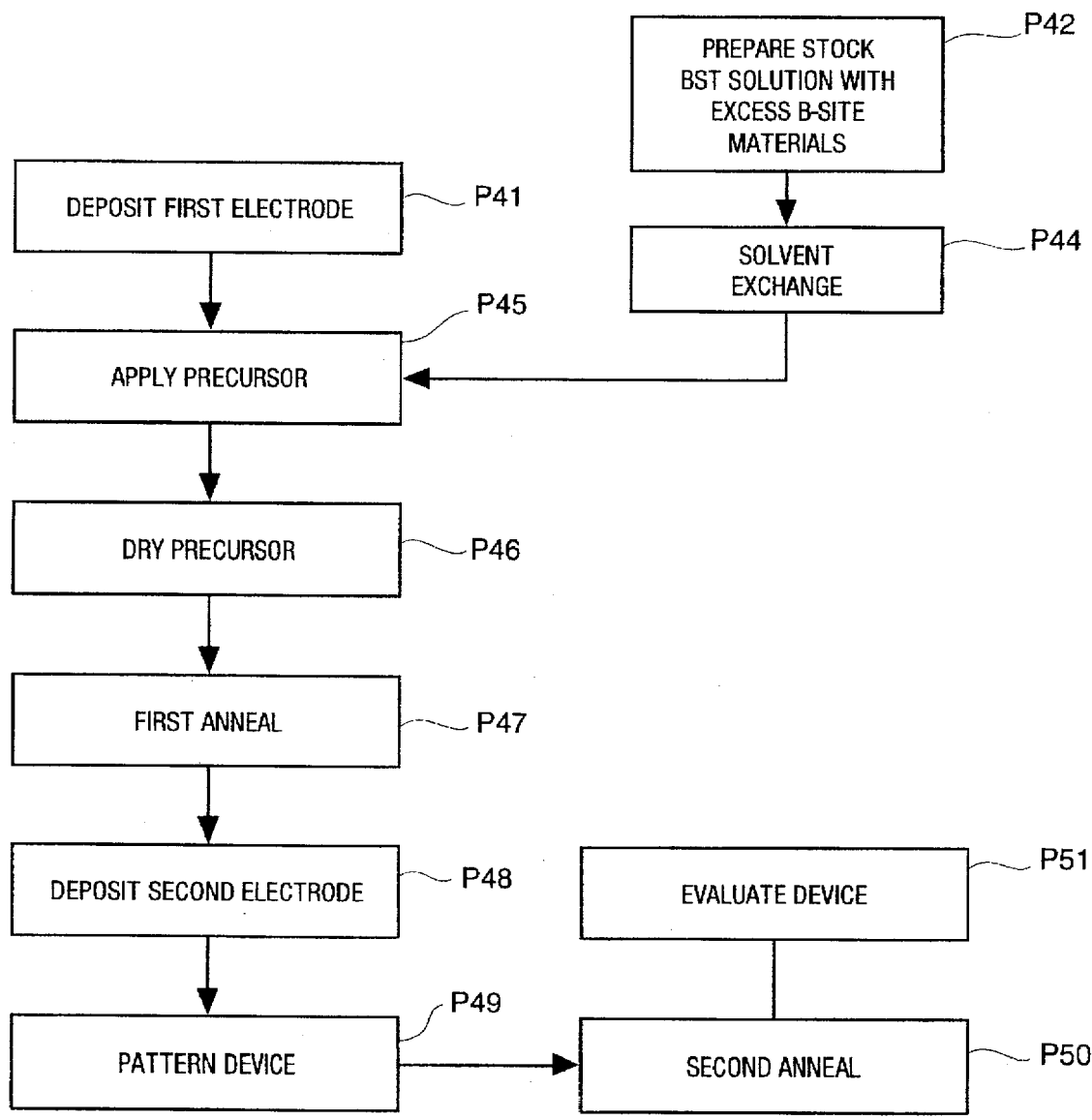
FIG. 4 is a flow chart of a process according to the present invention for fabricating an excess B-site material, BST capacitor.

FIG. 4 depicts a flow chart of the process for fabricating capacitors 10, 20 and 30 of the present invention. The process shall be discussed in terms of the embodiment of FIG. 1, but could just as well be discussed in terms of the other embodiments also. Steps P41 through P44 may all be performed in advance of the device fabrication steps beginning with P45. In step P41 a first electrode 14 is deposited onto substrate 13, preferably by sputtering platinum as is known in the art.

In step P42, a BST stock solution is prepared with excess stoichiometric amounts of B-site materials, for subsequent use in step P45 and the eventual formation of dielectric layer 15. Step P42 may be completed at a time just prior to deposition of dielectric layer 15, but is generally done well in advance. The solution preparation steps P42 and P44 are preferably done under an inert atmosphere, such as an argon atmosphere.

An important feature of the invention is the ease with which specific excess B-site material concentrations can be added. In the prior art, utilizing methods such as doping, the precise dopant level achieved would be significantly less predictable and uniform when compared to that achieved using the methods of the present invention, due to inherent randomness in prior processes such as sputtering. Rather, in the prior art, one would fabricate a device, then test it to see what concentration was obtained. In the method of fabrication according to the present invention, precise, uniform, and repeatable excess B-site material concentrations can easily be obtained. It should be apparent that the present invention lends itself to manufacturing much more readily than the prior art.

The BST stock solution is a liquid precursor as described in co-pending U.S. patent application Ser. No. 08/132,744 filed Oct. 6, 1993 and hereby incorporated by reference herein; however, as will be described below in more detail, some differences exist between the 08/132,744 solution and that of the present invention. In summary, the precursor is preferably made by reacting barium with 2-methoxyethanol and 2-ethylhexanoic acid, adding strontium, allowing the mixture to cool, adding titanium isopropoxide and 2-methoxyethanol but with excess B-site material such as titanium to achieve an excess B-site material concentration of between 0.1 and 20 mol %, and heating to obtain a final BST concentration of about 0.5 moles. Other polyoxyalkylated metal compounds may be used in forming the precursor solution including: barium alkoxides, strontium alkoxides, and titanium alkoxides; barium carboxylates, strontium carboxylates, and titanium carboxylates. Particularly preferred alkoxides and carboxylates include barium 2-ethylhexanoate, strontium 2-ethylhexanoate, and titanium isopropoxide; barium 2-ethylhexanoate, strontium 2-ethylhexanoate, and titanium 2-ethylhexanoate; barium neodecanoate, strontium neodecanoate, and titanium isopropoxide; barium neodecanoate, strontium neodecanoate, and titanium neodecanoate; barium octanoates, strontium octanoates, and titanium octanoates. In the precursor, the B-site material is generally included as a substituent to an organic complex.

The solvent exchange step P44 is then performed; however, this step, while very useful, is not absolutely necessary. The solvent exchange primarily replaces a solvent that is convenient for manufacturing the stock solution and/or which makes a precursor that stores well, for a solvent that has a viscosity appropriate for the application process, such as the preferred "spin-on" process. An appropriate viscosity herein preferably means a lower viscosity than the stock solution. Preferably, in the solvent exchange, xylene is exchanged for the 2-methoxyethanol solvent of the BST stock solution. In the xylene exchange, xylene is added to the solution and the solution is heated to about 130° C. while stirring to boil away the other solvents, such as 2-methoxyethanol. N-butyl acetate also works well as a solvent, and may be substituted for xylene in the solvent exchange.

This manner of forming the precursor permits extremely accurate amounts of the excess B-site material to be added to the BST, and the thorough stirring in the solvent exchange step, or other mixing step, ensures uniform dispersion of the excess B-site material throughout the BST.

The use of carboxylates and alkoxides in this process is an important factor, because gels are not formed, otherwise, gel formation could impede the mixing and uniform dispersion of the excess B-site material into the BST. All liquid chemicals used in making the precursors, such as xylene, n-butyl acetate, and 2-methoxyethanol are preferably semiconductor grade chemicals, which is a well-known term in the semiconductor art.

In step P45 the precursor solution produced from step P44 is applied to the substrate 18. This treating step is preferably conducted by applying the precursor solution to substrate 18 and spinning substrate 18 at 1000 RPM to 2000 RPM for a time ranging from about 20 seconds to 60 seconds; however, other application methods may be used. By way of example, it is possible to use an alternative misted deposition process as described in co-pending U.S. patent application Ser. No. 07/993,380 filed Dec. 18, 1992.

In steps P46 and P47 the precursor is treated to form metal oxide dielectric material 15 on substrate 18. The treating is preferably completed by drying and annealing the result of step P45. In step P46 the precursor is dried, preferably in dry air or nitrogen, and preferably at a relatively high temperature as compared to the prior art, i.e. at from 200° C. to 500° C. Most preferably, drying is performed in air at about 400° C. for a time ranging from about 2 to 10 minutes. This high temperature drying step is essential in obtaining predictable properties in BST having excess B-site material added.

In step P47, the dried precursor is annealed to form dielectric layer 15. The annealing step is referred to as the first anneal to distinguish it from a later anneal. This first anneal is preferably performed in oxygen at a temperature of from about 600° C. to 850° C. This step is most preferably performed at a temperature of about 800° C. for 70 minutes in $O_2$ in a push/pull process including 10 minutes for the "push" into the furnace and 10 minutes for the "pull" out of the furnace. Careful control of the annealing temperature and time is also essential for predicable dielectric layer results.

In step P48, a second electrode 16 is deposited as discussed above. The device is then patterned, which may comprise only the patterning of the second electrode if any patterning was done after deposition of the first electrode. It is important that the device be patterned before the second anneal step P50 so that patterning stresses are removed by the anneal and any oxide defects created by the patterning are corrected. The second anneal at step P50 is preferably performed at the same temperature as the first anneal in step P47 though variance within a small temperature range of 50° C. to 100° C. about the first anneal temperature is possible depending on the excess B-site material chosen above. The time for the second anneal is preferably less than for the first anneal, generally being about 30 minutes, though again a range of times from about 20 minutes to 90 minutes is possible depending on the sample. Again, careful control of the anneal parameters is important to obtain predictable results. Finally, in step P51 the device is completed and evaluated.

Another factor that is important in obtaining good, predictable results in the dielectric materials is the use of high purity barium, strontium and titanium in making the precursors. Usually, what is called "high purity" barium, strontium, and titanium in the trade has impurity levels of between 1 in $10^4$ and 1 in $10^5$ atoms of impurities for the more abundant elements. Impurity levels this high will be referred to herein as "R&D grade" materials. Precursor solutions made with such R&D grade materials do not provide sufficiently predictable results for materials used in the present invention. The methods of the present invention require the use of material with higher purity, i.e. with impurities of less than 1 in $10^5$ atoms of impurities for any one element, or less than 10 parts per million.

Accordingly, a further feature of the invention is that the metal oxide precursors preferably contain impurities of less than 10 parts per million per impurity element. Relatively small amounts of impurities appear to give the best results in many cases. The normal level of impurity content in R&D grade BST may interfere with the desired dielectric properties. Moreover, since small amounts of impurities can make a significant difference in the electrical properties, for the results to be predictable, the material preferably should have impurities of 10 parts per million or less for each impurity element.

EXAMPLES

The following non-limiting examples set forth preferred methods and materials that may be utilized to practice the present invention.

Example 1: Reagent Purity Determination

Table 1 shows the measured impurity levels in parts per million for this higher purity precursor solutions and the R&D grade precursor solutions. Where an entry is left blank the impurity was not specified.

TABLE 1

| IMPURITY | HIGH PURITY SOLUTION Impurity Level in PPM | R & D SOLUTION Impurity Level in PPM |
| --- | --- | --- |
| Na | 4.3 | 65 |
| K | 2.4 | 52 |
| Mn | 0.6 | 31 |
| Fe | <0.3 | 8 |
| Ni | 0.2 | |
| Mg | <0.1 | |
| Ca | 1.9 | |
| Zn | 0.1 | |
| Al | 0.3 | |
| Ag | <0.1 | |
| Cd | <0.1 | |
| Cu | 0.6 | |
| Li | <0.1 | |
| Mo | <2 | |
| Co | <0.1 | |
| Cr | <0.05 | |
| U | <0.002 | <5 |
| Th | <0.002 | <5 |

As indicated in Table 1, the higher purity solution included no impurity element at a concentration greater than 4.3 parts per million, and the total of all impurities was only about 13 parts per million. The R&D grade solutions had impurity levels of 10 to 100 times higher. The impurity level for most impurities is preferably 1 part per million or less.

Example 2: Production of BST Films on an Electrode by Using Excess B-Site Materials Various samples were produced with excess B-site material added to precursor solutions in accord with the methods of the present invention.

A standard stock solution containing 0.33M BST ($Ba_{0.7}Sr_{0.3}TiO_3$) in 2-methoxyethanol was supplemented with 1 mol % titanium added as the excess B-site material.

After the B-site material supplementation, a xylene exchange was performed on the mixture. Xylene was introduced into the mixture in an amount sufficient to replace the 2-methoxyethanol to be removed by distillation, and the solution was heated to about 130° C. to distill off the non-xylene solvent fraction. Ignoring the excess B-site materials, the final precursor solution had a molarity of 0.32M.

The precursor was applied to the substrate 18 under an inert atmosphere, spun at 1500 RPM for about 30 seconds, dried at 400° C. for 2 minutes on a hot plate in air, and annealed at 750° C. in oxygen for 70 minutes including a 10 minute push in and 10 minutes pull out. The final thickness of the BST layer 15 was 1600 Å.

Top electrode 16 was deposited and patterned. Capacitor 10 was then annealed again at 750° C. for 30 minutes in oxygen, including a 10 minute push in and pull out.

These method steps were repeated for four other samples by substituting different amounts for the 1% B-site material that was utilized above. These four additional samples were fabricated with titanium as the excess B-site material added to concentrations of 0 mol % (control), 3 mol %, 5 mol %, and 10 mol %. This first set of five total samples was annealed at 750° C., in like manner with the sample for the first (1%) concentration.

A second set of five samples, including concentrations identical to the first set were fabricated using the same excess B-site material concentrations as above but were annealed at 800° C.

The electrical properties of the ten samples were measured according to standard techniques. FIG. 5 depicts a comparison of the electrical properties of the ten samples were thus evaluated. The FIG. 5 results include the real part of the dielectric constant, $\epsilon$, the scale for which is on the left, and the dissipation factor, tan $\delta$, the scale for which is on the right. The abscissa for both ordinates is the excess B-site titanium content in mole percent. The measurements for the samples which were annealed at 750° C. are shown with open circles, while the measurements for the samples which were annealed at 800° C. are shown by filled circles. The dielectric constant steadily rises with increased excess B-site titanium, while the dissipation factor only rises slightly or remains about the same. The anneal temperature makes a significant difference with respect to the dielectric constant, $\epsilon$, but makes little difference with respect to the dissipation factor, tan $\delta$.

A third set of 3 sample capacitors 10 as shown in FIG. 1 were also made. In two samples of the set a mixture of dysprosium oxide, $Dy_2O_3$, and chromium $Cr_2O_3$, was the dopant material in $Ba_{0.7}Sr_{0.3}TiO_3$. $Dy_2O_3$ is considered to be an A-site dopant while $Cr_2O_3$ is considered to a B-site dopant. In the first sample the amount of $Dy_2O_3$—$Cr_2O_3$ dopant was 0.4 mole %, i.e. 0.4 mol % of $Dy_2O_3$ and 0.4 mole % of $Cr_2O_3$, and in the second sample the amount of $Dy_2O_3$—$Cr_2O_3$ dopant was 1.0 mole %. in the third sample, the dopant was the same as the second sample except that 1.0 mole % of a second B-site dopant, titanium, was also added. In each case, the stock BST solution was a 0.5M BST solution (R & D grade), made as described above and diluted to 0.3M with n-butyl acetate; e.g. 2 ml of the above BST solution were added to 1.3 ml n-butyl acetate to yield the final BST precursor solution. The dopant solution was the metal 2-ethylhexanoate in xylene, with about 0.1109 mmole of Dy, 0.0366 mmole of chromium, and 0.9144 mmole of titanium per gram, respectively, for the three dopant precursors. The solution was spun at between 1600 rpm and 2000 rpm and yielded a film of about 700 Å–900 Å per coat. The drying step P46 was performed at 400° C. on a hot plate, in air for 2 minutes. The first anneal step P47 was at 750° C. for 80 minutes in $O_2$, and the 2nd anneal P50 was at 750° C. for 30 minutes in $O_2$. The thickness of the dielectric 15 in the samples was from 1440 Å to 1510 Å.

Figure 6:
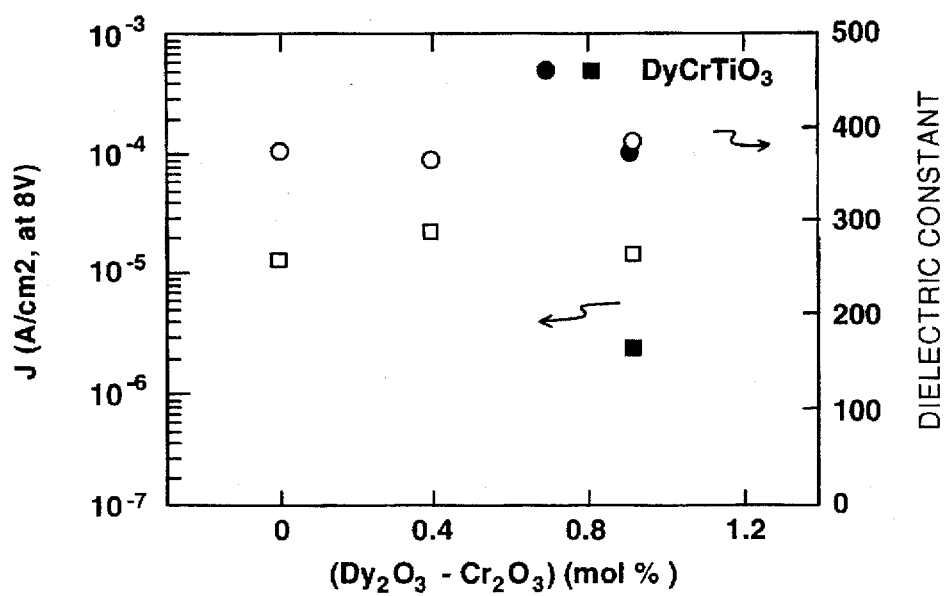
FIG. 6 is a graph of the dielectric constant and current density versus dopant concentration for capacitors made with $Dy_2O_3$—$Cr_2O_3$ and titanium dopants.

The three samples were tested and compared with the sample with no doping with the results shown in FIG. 6. In this figure, the dielectric constant (indicated by circles) and current density, J, in amps/cm$^2$ (indicated by squares) are plotted as a function of concentration of the $Dy_2O_3$—$Cr_2O_3$ dopant in mol. %. The solid symbols are for the titanium-doped sample. The dielectric constant and the current density for the $Dy_2O_3$—$Cr_2O_3$ doping vary only a little from the results for the $Ba_{0.7}Sr_{0.3}TiO_3$ thin film, however the addition of the titanium B-site dopant significantly improves the current density, i.e. drops it nearly a factor of 10, without appreciably changing the dielectric constant. This again indicates that the use of B-site titanium doping can be advantageous to optimize the electrical properties of metal oxides to permit the fabrication of metal oxide thin films that are practical for use in integrated circuits.

There have been described novel structures and processes for fabricating integrated circuit capacitors using metal oxides such as BST with excess B-site material added. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, the materials and methods described with respect to the capacitor 10 of FIG. 1 may be used with other capacitor structures, such as that of FIG. 3 or many other variations of capacitors; or the buffer layers 25 and 27 of FIG. 2 may be used in combination with the capacitors of FIGS. 1 and 3 as well as other capacitor structures. The structures and processes may be combined with a wide variety of other structures and processes. Equivalent materials, different material thicknesses, and other methods of depositing the substrate and electrode layers may be used. It is also evident that the process steps recited may in some instances be performed in a different order, or equivalent structures and processes may be substituted for the various structures and processes described.

We claim:

1. A non-stoichiometric metal oxide precursor solution for fabricating integrated circuit thin films, said precursor solution comprising:

a stoichiometric portion including total A-site and total B-site metals in a 1:1 ratio capable of satisfying a formula; and excess B-site material added to said stoichiometric portion including B-site material in an amount ranging from 0.01 mol % to 100 mol % of the amount of total amount of B-site material required to satisfy said formula.

2. The precursor of claim 1 wherein said stoichiometric portion comprises barium, strontium, and titanium in amounts corresponding to a formula ($Ba_xSr_{1-x}TiO_3$), wherein x is a number ranging from zero to one.

3. The precursor of claim 2 wherein said excess B-site material comprises titanium in an amount greater than 0.1 mol % and less than 20 mol %.

4. The precursor of claim 1 wherein said excess B-site material comprises titanium in an amount ranging from 1 mol % to 3 mol %.

* * * * *